United States Patent
Kotikelapudi et al.

(10) Patent No.: US 11,949,364 B2
(45) Date of Patent: Apr. 2, 2024

(54) PEAK CURRENT REGULATION FOR STEPPER MOTORS

(71) Applicant: TEXAS INSTRUMENTS INCORPORATED, Dallas, TX (US)

(72) Inventors: Venkata Naresh Kotikelapudi, Bangalore (IN); Ganapathi Shankar Krishnamurthy, Bangalore (IN); Laxman Sreekumar, Thrissur (IN); Siddhartha Gopal Krishna, Bengaluru (IN)

(73) Assignee: Texas Instruments Incorporated, Dallas, TX (US)

(*) Notice: Subject to any disclaimer, the term of this patent is extended or adjusted under 35 U.S.C. 154(b) by 48 days.

(21) Appl. No.: 17/489,269

(22) Filed: Sep. 29, 2021

(65) Prior Publication Data

US 2023/0097035 A1   Mar. 30, 2023

(51) Int. Cl.
*H02P 8/38* (2006.01)
*G01R 19/165* (2006.01)
*H02P 7/03* (2016.01)
*H02P 8/12* (2006.01)
*H02P 8/34* (2006.01)
*H03K 5/24* (2006.01)
*H03K 3/0233* (2006.01)

(52) U.S. Cl.
CPC .......... *H02P 8/12* (2013.01); *G01R 19/16538* (2013.01); *H02P 7/04* (2016.02); *H02P 8/34* (2013.01); *H03K 5/24* (2013.01); *H03K 3/02337* (2013.01)

(58) Field of Classification Search
CPC ...... H02P 8/12; H02P 7/04; H02P 8/34; H02P 8/16; G01R 19/16538; H03K 5/24; H03K 3/02337
See application file for complete search history.

(56) References Cited

U.S. PATENT DOCUMENTS

| | | | |
|---|---|---|---|
| 4,686,437 A * | 8/1987 | Langley | H02P 6/085 318/400.03 |
| 6,051,942 A * | 4/2000 | French | H02P 9/40 318/254.1 |
| 2014/0219401 A1* | 8/2014 | Finkelstein | H04B 15/06 327/175 |
| 2015/0061554 A1* | 3/2015 | Kuratani | H02P 6/16 318/400.04 |
| 2019/0109551 A1* | 4/2019 | Saw | H02P 8/12 |

* cited by examiner

*Primary Examiner* — Muhammad S Islam
(74) *Attorney, Agent, or Firm* — Valerie M. Davis; Frank D. Cimino

(57) ABSTRACT

A method for controlling a stepper motor includes calculating a duty cycle of a current provided to the stepper motor and comparing a difference, between the calculated duty cycle and a base duty cycle of current provided to the stepper motor under a base load condition, to a reference duty cycle value. The method also includes adjusting a peak current level of the current provided to the stepper motor responsive to the comparison.

20 Claims, 4 Drawing Sheets

PEAK CURRENT REGULATION FOR STEPPER MOTORS

CROSS-REFERENCE TO RELATED APPLICATIONS

The present application relates to co-pending U.S. patent application Ser. No. 17/489,233, which was filed Sep. 29, 2021, is titled "GATE DRIVER CIRCUIT WITH CHARGE PUMP CURRENT CONTROL," and is hereby incorporated herein by reference in its entirety.

BACKGROUND

A stepper motor includes a rotor and a stator and converts electrical energy into mechanical energy. At least one type of stepper motor includes two coils that receive current from a stepper driver to control the position and/or speed of the rotor. A position of the rotor can be held in a constant position by sending a current waveform having a constant amplitude to the stepper motor. The position of the rotor can be rotated by sending a current waveform having a variable amplitude to the stepper motor (e.g., a current waveform having a sinusoidal amplitude can be sent to the stepper motor to rotate the rotor). The current waveform sent to the stepper motor can be provided by controlling a voltage applied to the stepper motor (e.g., a voltage applied to a pair of poles of the stator). For instance, the stepper motor may be a unipolar stepper motor having a single pair of poles, or the stepper motor may be a bipolar stepper motor having two pairs of poles. Each pair of poles may have metal-oxide-semiconductor field-effect transistors (MOSFETs) that receive pulse-width modulation (PWM) signals from a driver to control the voltage applied to the pair of poles to provide an appropriate current waveform.

SUMMARY

In accordance with at least one example of the disclosure, a method for controlling a stepper motor includes calculating a duty cycle of a current provided to the stepper motor and comparing a difference, between the calculated duty cycle and a base duty cycle of current provided to the stepper motor under a base load condition, to a reference duty cycle value. The method also includes adjusting a peak current level of the current provided to the stepper motor responsive to the comparison.

In accordance with another example of the disclosure, a device is adapted to be coupled to a stepper motor and operable to control the stepper motor. The device includes a processing device having a first output adapted to be coupled to the stepper motor and a second output. The processing device is configured to calculate a duty cycle of a current provided to a stepper motor; and output, at the second output, a calculated duty cycle signal indicative of the calculation. The device also includes at least one register coupled to the processing device and configured to store a base duty cycle value of current provided to the stepper motor under a base load condition, and to store a reference duty cycle value. The device further includes a subtractor coupled to the processing device and to the at least one register. The subtractor is configured to receive the calculated duty cycle signal, and provide a subtractor signal responsive to a difference between the calculated duty cycle and the base duty cycle value. The device includes an error amplifier coupled to the subtractor and to the at least one register. The error amplifier is configured to receive the subtractor signal, compare the subtractor signal to the reference duty cycle value, and provide an error signal responsive to the comparison. The processing device is further configured to adjust a peak current level of the current provided to the stepper motor responsive to the error signal.

In accordance with yet another example of the disclosure, a system is adapted to be coupled to a stepper motor and operable to control the stepper motor. The system includes a driver coupled to the stepper motor. The driver is configured to control a voltage applied to the stepper motor. The system also includes a controller coupled to the driver. The controller is configured to calculate a duty cycle of a current provided to the stepper motor; compare a difference, between the calculated duty cycle and a base duty cycle of current provided to the stepper motor under a base load condition, to a reference duty cycle value; and adjust a peak current level of the current provided to the stepper motor responsive to the comparison.

BRIEF DESCRIPTION OF THE DRAWINGS

For a detailed description of various examples, reference will now be made to the accompanying drawings in which.

The same reference numbers or other reference designators are used in the drawings to designate the same or similar (functionally and/or structurally) features.

DETAILED DESCRIPTION

Figure 1:
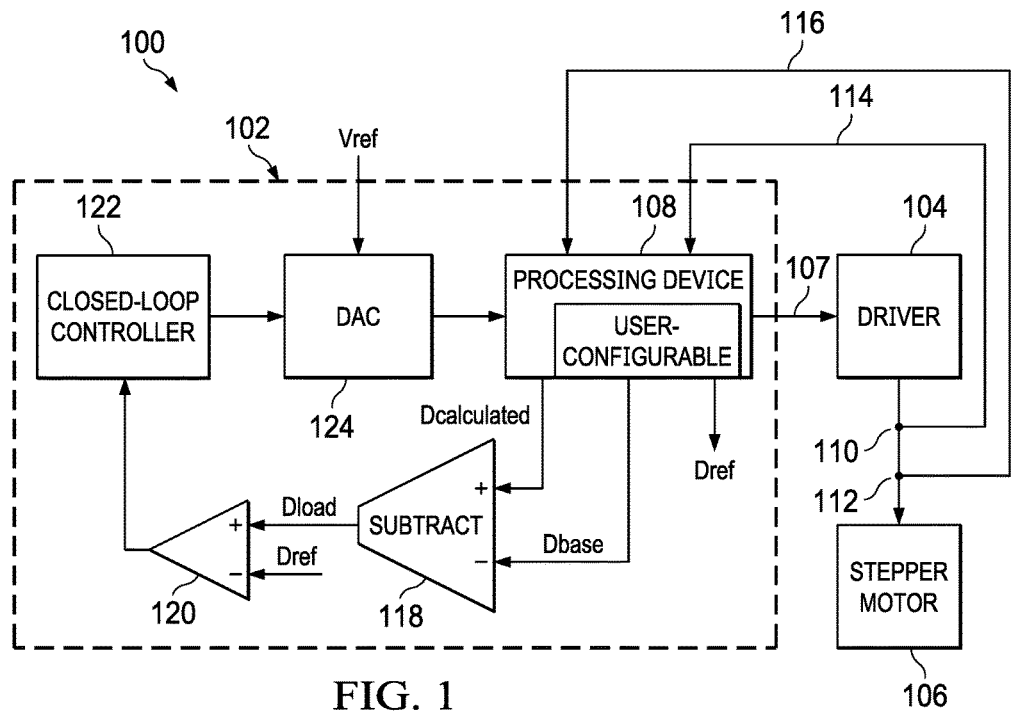
FIG. 1 is a block diagram of a system for peak current regulation of a stepper motor using duty cycle feedback in accordance with various examples.

Stepper motors are used in a variety of different application settings such as, but not limited to, two-dimensional or three-dimensional printing, medical applications, gimbles, drones and textile manufacturing. Irrespective of the particular application, stepper motors commonly encounter varying mechanical loads in use. In some cases, a stepper motor controller and driver are operated to control a current through coils of the stepper motor to maintain a peak coil current at a desired level (e.g., sufficient to avoid stalling the motor). An output power of the stepper motor is regulated, to provide for different mechanical loads, by varying a duty cycle over which power is transferred to the motor.

However, by maintaining the peak coil current at the desired level irrespective of mechanical load, power losses in the motor, such as due to direct current (DC) resistance of the motor coils (e.g., $I^2R$ losses), are increased. In addition to increased $I^2R$ losses, stepper motors with relatively higher peak coil currents include larger components to facilitate heat transfer away from the coils, which increases the bulk of the motor. In some cases, durability (e.g., longevity) and reliability of stepper motors with relatively higher peak coil currents are reduced, such as due to the additional thermal stresses on the coils and other motor components.

Examples of this description address the foregoing by providing a closed-loop feedback control of the stepper motor based on a calculated duty cycle of current provided to the stepper motor, a base duty cycle value, and a reference duty cycle value. The base duty cycle is based on the current provided to the stepper motor under a base load condition, such as a no-load condition in which a mechanical load is not coupled to the stepper motor. The reference duty cycle is based on the current provided to the stepper motor under a maximal load condition, and with a maximal peak current level. Both the base duty cycle and the reference duty cycle can be user-configurable values, which can depend on the particular application of the stepper motor.

A difference between the calculated duty cycle and the base duty cycle results in a loaded duty cycle value, which is correlated (e.g., linearly) to the mechanical load on the stepper motor. For example, the base duty cycle corresponds to other system losses, such as $I^2R$ losses and switching loses. Accordingly, subtracting the base duty cycle from the calculated duty cycle removes the impact of the system losses from the resulting loaded duty cycle.

The loaded duty cycle, or the difference between the calculated duty cycle and the base duty cycle, is compared to the reference duty cycle. A peak current level of the current provided to the stepper motor is adjusted responsive to the comparison. Accordingly, examples of this description provide closed-loop feedback to maintain the duty cycle of current provided to the stepper motor near the reference duty cycle, while varying the peak current level to accommodate varying mechanical loads on the stepper motor.

By allowing the peak coil current in the stepper motor to decrease under lighter mechanical loading, $I^2R$ losses are reduced. Additionally, due to decreased coil currents (e.g., not always operating at a desired peak coil current irrespective of mechanical load) in stepper motors controlled according to the described examples, such stepper motors can be designed with smaller heat transfer component(s) (and thus motor form factors), and can have increased durability and/or reliability. These and other examples are described below, with reference to the accompanying figures.

FIG. 1 is a block diagram of a system 100 including a motor controller 102 coupled to a motor driver 104, which in turn is adapted to be coupled to a stepper motor 106. The system 100 is for current regulation of the stepper motor 106 using duty cycle feedback in accordance with various examples. The system 100 can be used in any setting or application that uses the stepper motor 106. The motor controller 102 and the motor driver 104 are configured to control the operation of the stepper motor 106. For example, the motor controller 102 (or a processing device 108 of the motor controller 102) is configured to provide a control signal 107 to the motor driver 104. The stepper motor 106 may include multiple coils (e.g., first and second coils), and the motor driver 104 controls a current through each of the coils. In some cases, the current through the coils (e.g., current through each of the coils wrapped around a portion of a stationary stator) is approximately sinusoidal and the current through each subsequent coil is out of phase (180 degrees/number of coils out of phase) with the current through the preceding coil (e.g., the second coil is 90 degrees out of phase with respect to the current through the first coil). The control signal 107 can include a pulse-width modulation (PWM) signal that is provided to driver 104. Responsive thereto, driver 104 provides a voltage waveform to each coil in the stepper motor 106 to produce a desired current waveform drawn by the stepper motor 106. The system 100 also includes one or more current sensors 110, and one or more voltage sensors 112.

The motor driver 104 receives the control signal 107. The motor driver 104 can be an integrated driver or a combination of a pre-driver and a metal-oxide-semiconductor, field-effect transistor (MOSFET) circuit (e.g., one or more MOSFETs, such as power MOSFETs, used to drive the stepper motor 106). The integrated driver optionally includes logic, a gate driver, MOSFETs, and protection and current control circuitry integrated into one device. The combination of the pre-driver (e.g., including the logic, the gate driver, and the protection and current control circuitry) and the MOSFET circuit separates the lower voltage logic devices from the higher voltage/current devices used to drive the stepper motor 106. However, other examples may include different motor driver 104 configurations and/or types of motor drivers 104. The motor driver 104 uses the control signal 107 to switch the individual MOSFETs that control the voltage applied to the stepper motor 106. For instance, when the control signal 107 is a PWM signal, the motor driver 104 uses the PWM signal to switch the MOSFETs to create a voltage waveform across the stepper motor 106 corresponding to the PWM signal. The voltage waveform across the stepper motor 106 is measured by the one or more voltage sensors 112, and the voltage measurement 116 is fed back to the motor controller 102. The current waveform drawn by the stepper motor 106 is measured by the one or more current sensors 110 and is fed back to the motor controller 102 as the current measurement 114.

Figure 2:
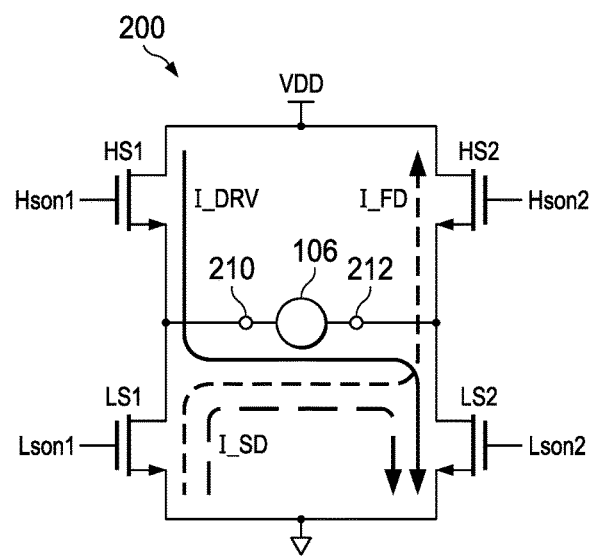
FIG. 2 is a circuit schematic diagram of an example of an H-bridge in accordance with various examples.

The MOSFETs in driver 104 may be configured as one or more H-bridges (e.g., one H-bridge is used for each coil included in the stepper motor 106), which controls the current to a motor coil. FIG. 2 shows an example of an H-bridge 200 (used, e.g., for a stepper motor with a single coil). The H-bridge 200 includes high side (HS) transistors HS1 and HS2 and low side (LS) transistors LS1 and LS2. In this example, the transistors are n-type MOSFETs (NMOS), but can be different types of transistors in other examples. The drains of HS1 and HS2 are coupled together and to a supply voltage rail, VDD. The sources of LS1 and LS2 are coupled together and to a ground terminal. The source of HS1 is coupled to the drain of LS1 and provides a first H-bridge output 210. The source of HS2 is coupled to the drain of LS2 and provides a second H-bridge output 212. A coil of the stepper motor 106 is coupled to outputs 210 and 212. Other motor coils are similarly coupled to a separate H-bridges, not specifically shown in FIG. 2.

Each of the transistors HS1, HS2, LS1, LS2 has a control input (gate) and can be independently controlled. The stepper motor driver 104 can control the transistors HS1, HS2, LS1, LS2 of the H-bridge 200 to implement three modes of operation, including a drive mode, and two different decay modes. The two decay modes include a fast decay (FD) mode and a slow decay (SD) mode.

During the drive mode, HS1 and LS2 are turned on, and HS2 and LS1 are turned off. Accordingly, in the drive mode, a current I_DRV flows from VDD through HS1, the stepper motor 106, and LS2, to the ground terminal. The motor coil coupled between outputs 210 and 212 functions as a variable inductor, and a coil current increases at a rate of VDD/L, where L is the inductance of the motor coil.

During the FD mode, HS2 and LS1 are turned on, and HS1 and LS2 are turned off. Because of the inductance of the motor coil coupled between outputs 210 and 212, in the FD mode, a current I_FD flows from the ground terminal through LS1, the stepper motor 106, and HS2, to VDD. Relative to the drive mode, during the FD mode, the voltage VDD is applied to the stepper motor 106 with an opposite polarity, which encourages the inductive current to decay relatively quickly. For example, the current I_FD decays at a rate of −VDD/L.

During the SD mode, LS1 and LS2 are turned on, and HS1 and HS2 are turned off. Accordingly, in the SD mode, a current I_SD flows through LS1, the stepper motor 106, and LS2. As suggested by the name, in SD mode the coil current does not decay as quickly as in FD mode. For example, relative to the FD mode, during the SD mode, there is no applied voltage to more rapidly discharge the coil current, because the coil current is recirculated through LS1 and LS2. Accordingly, during the SD mode, coil current is dissipated (e.g., as heat) due to resistance of the stepper motor 106 and on-state resistance of LS1 and LS2.

Figure 3:
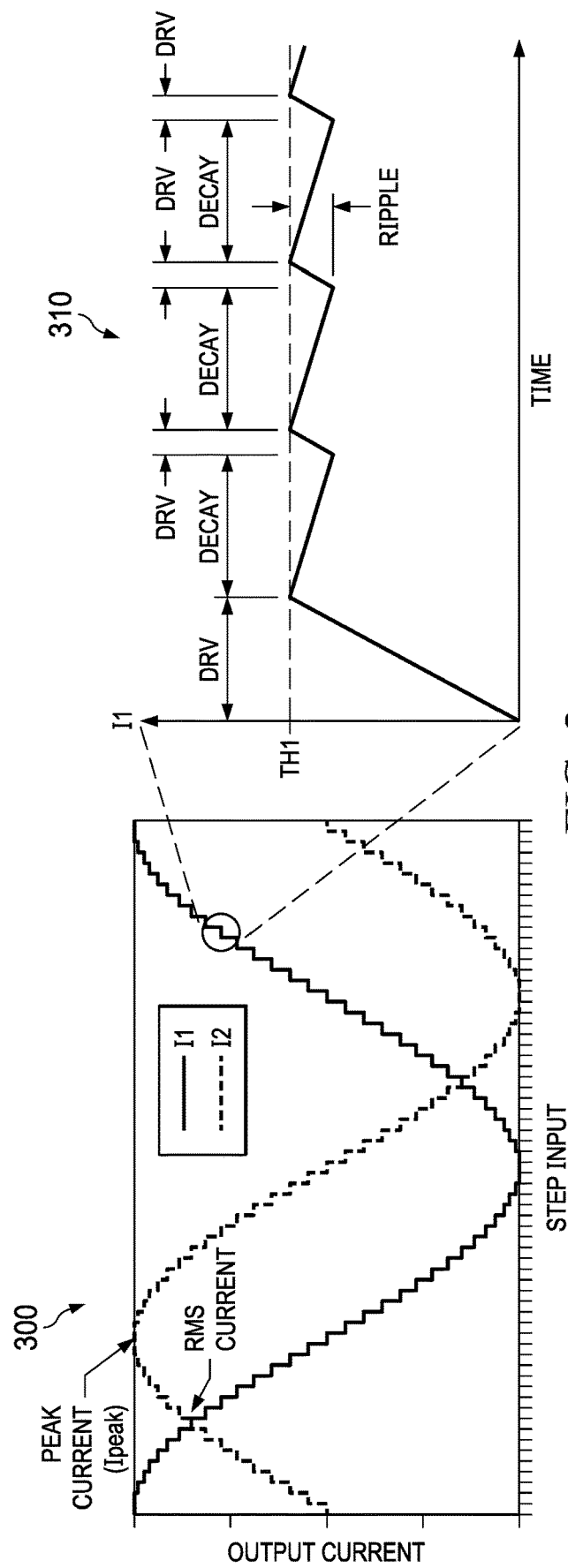
FIG. 3 is a graph of waveforms of stepper motor coil currents in accordance with various examples.

FIG. 3 is a graph 300 of waveforms of stepper motor coil currents in accordance with various examples. The waveforms include waveform I1, which reflects an approximately sinusoidal current through the first coil of stepper motor 106, and waveform I2, which reflects an approximately sinusoidal current through the second coil of stepper motor 106. As described, I1 and I2 are 90 degrees out of phase. Each current I1, I2 is formed as a series of discrete steps (e.g., produced by a digital-to-analog converter (DAC) of the motor controller 102 or motor driver 104). The motor controller 102 and/or motor driver 104 is configured to regulate the current in each coil at each step, as well as a peak current for the waveforms I1, I2 (Ipeak). As described above, the current to the motor coils is controlled by H-bridge 200.

An expanded portion 310 shows the coil current at a given step. At each step, the H-bridge 200 is operated in drive mode (DRV) and current through the motor coil increases as shown. Responsive to the current through the motor coil reaching a threshold (e.g., TH1), a decay mode (either FD or SD) begins, and the current through the motor coil decreases. At each step, the H-bridge 200 is controlled between alternating drive and decay modes to regulate the current through the motor coil to the threshold TH1 for that step. As described further below, the drive mode time divided by the drive plus decay mode times is a duty cycle of current provided to the stepper motor 106. The duty cycle of current provided to the stepper motor 106 can also be determined using the drive mode time minus the fast decay (FD) time, because current flows back to VDD during the FD time and thus represents power being provided to the supply rail. The result of drive mode time minus the FD time is then divided by the drive plus decay mode times to provide the duty cycle of current provided to the stepper motor 106.

Referring again to FIG. 1, the motor controller 102 includes a processing device 108, such as a digital control circuit, a microcontroller, an application-specific integrated circuit (ASIC), a field-programmable gate array (FPGA), or other programmable circuitry. The processing device 108 of the motor controller 102 is configured to receive a current measurement 114 (e.g., an instantaneous current measurement) from the one or more current sensors 110 and a voltage measurement 116 (e.g., an instantaneous voltage measurement) from the one or more voltage sensors 112. The one or more current sensors 110 may include an ammeter connected in series between the motor driver 104 and the stepper motor 106, and the voltage sensor 112 may include a voltmeter connected in parallel across the stepper motor 106 (e.g., across a coil of the stator of the stepper motor 106). In alternative embodiments, multiple current and/or voltage sensors are utilized so that at least one current sensor and one voltage sensor is connected to each coil of stepper motor 106. In these embodiments, multiple current measurements 114 and multiple voltage measurements 116 will be provided to processing device 108.

The current measurement 114 represents the current being drawn by the stepper motor 106. For instance, the current measurement 114 represents the current being drawn by a coil of the stator of the stepper motor 106. The voltage measurement 116 represents the voltage being applied to the stepper motor 106. For instance, the voltage measurement 116 represents the voltage being applied to the coil of the stator of the stepper motor 106. The processing device 108 of motor controller 102 uses the current measurement 114, and/or the voltage measurement 116 to calculate a peak current duty cycle of a current provided to the stepper motor 106. The calculation of the peak current duty cycle is described further below. The processing device 108 is configured to provide a signal indicative of the peak current duty cycle (Dcalculated), such as a digital value that represents the calculated peak current duty cycle.

The motor controller 102 implements a closed-loop feedback control of the stepper motor 106 based on the peak current duty cycle calculated by the processing device 108, as well as a base duty cycle value (Dbase) and a reference duty cycle value (Dref). The base duty cycle is based on the current provided to the stepper motor 106 under a base load condition, such as a no-load condition in which a mechanical load is not coupled to the stepper motor 106. The base duty cycle value may be user-configurable (or configured at motor start-up or during manufacturing/test of the motor system), and thus can be based on operating the stepper motor 106 in a controlled environment (e.g., unloaded). The base duty cycle value can be stored in a first register, such as a user-configurable register of the processing device 108. The reference duty cycle is based on the current provided to the stepper motor 106 under a maximal load condition, and with a maximal peak current level. The reference duty cycle value may also be user-configurable (or configured at motor start-up or during manufacturing/test of the motor system), and thus can be based on operating the stepper motor 106 in a controlled environment (e.g., coupled to a maximal load, and operated at a maximal peak current level). The reference duty cycle value can be stored in a second register, such as a user-configurable register of the processing device 108. Both the base duty cycle and the reference duty cycle values can depend on the particular application of the stepper motor 106.

In various examples, the motor driver 104 receives power to be provided to the stepper motor 106 (Pmtr), which is equal to a voltage at supply terminals (e.g., the H-bridge 200 supply voltage rail voltage, VDD) times an average current (e.g., an average of a half-cycle of current waveform I1 or I2). The average current can be rewritten as a function of peak current (Ipeak) times a peak current duty cycle (D). Accordingly, $$Pmtr = VDD * Ipeak * D \quad (1)$$

The peak current duty cycle D is a weighted average over a half-cycle of current waveform I1 or I2. For example, for a sinusoidal current waveform of 'n' microsteps, the power transferred over a quadrant of the current waveform is:

$$Pmtr = VDD * (i_1 * D_1 + i_2 * D_2 + \ldots + i_n * D_n) \quad (2)$$

Each of the currents $i_1, i_2, \ldots, i_n$ can be rewritten as a coefficient k times Ipeak:

$$Pmtr = \text{VDD} * \text{Ipeak} * (k_1 * D_1 + k_2 * D_2 + \ldots + k_n * D_n) \quad (3)$$

In an example, the coefficients k are sinusoidal coefficients for the number of steps n. For example, for a sinusoidal current waveform having four microsteps (e.g., n=4), the power transferred in a half-cycle is approximately:

$$Pmtr = \text{VDD} * \text{Ipeak} * (0.383 * D_1 + 0.707 * D_2 + 0.924 * D_3 + D_4 + 0.924 * D_5 + 0.707 * D_6 + 0.383 * D_7) \quad (4)$$

The peak current duty cycle calculated by the processing device 108 may be a weighted average of the duty cycle at each step in a half-cycle of a sinusoidal current waveform. As demonstrated above, the weights at each step can correspond to sinusoidal coefficients derived for the number of microsteps in a quadrant of the sinusoidal current waveform. As described above, the duty cycle at each step can be determined using the drive mode time minus the FD time, which is then divided by the drive plus decay mode times to provide the duty cycle of current provided to the stepper motor 106 at a particular step.

The output power of the stepper motor 106 (Pout) is equal to a torque ($\tau$) applied to a load coupled to the stepper motor 106, times an angular velocity ($\omega$) of the stepper motor 106. To implement closed-loop feedback that reflects the mechanical load supplied by the stepper motor 106, it is useful to have a linear relationship between D (e.g., the value calculated by the processing device 108) and $\tau$, which is indicative of the mechanical load supplied by the stepper motor 106. However, Pmtr is not necessarily equal to Pout. For example, the motor driver 104 can introduce losses, such as switching losses and other IC-related losses. The stepper motor 106 can also introduce losses, such as due to DC resistance of the motor coils. For simplicity, these losses are collectively referred to as $I^2R$ losses. Thus, $$Pmtr = \text{Pout} + I^2R \quad (5)$$

In examples in which the base duty cycle (Dbase) is determined when the stepper motor 106 is unloaded, Dbase reflects a duty cycle value attributable to the $I^2R$ losses. Accordingly, subtracting Dbase from D (shown as Dcalculated in FIG. 1) results in a loaded duty cycle value that is proportional to the mechanical load (e.g., r) supplied by the stepper motor 106, and in which the impact of $I^2R$ losses are removed.

The motor controller 102 thus includes a subtractor 118 that is coupled to the processing device 108, as well as (or including) the register that contains the base, or no-load duty cycle value Dbase. The subtractor 118 is configured to provide a subtractor signal (Dload) responsive to a difference (Dcalculated−Dbase). Thus, Dload represents a loaded duty cycle value that is proportional to the mechanical load supplied by the stepper motor 106.

As described, the loaded duty cycle Dload is compared to the reference duty cycle Dref, and the closed-loop feedback of the motor controller 102 seeks to regulate the peak current level Ipeak such that Dload remains approximately equal to Dref. The motor controller 102 thus includes an error amplifier 120 that is coupled to the subtractor 118, as well as the register that contains the reference duty cycle value. The error amplifier 120 is configured to receive the subtractor signal Dload and compare Dload to Dref. An output of the error amplifier 120 is an error signal (e.g., an analog voltage or a digital value) that is proportional to the difference between Dload and Dref.

In another example, the error amplifier 120 is implemented as a hysteretic comparator 120, which is also coupled to the subtractor 118, as well as the register that contains the reference duty cycle value. The hysteretic comparator 120 is configured to receive the subtractor signal Dload and compare Dload to an upper threshold value and to a lower threshold value. The upper and lower threshold values of the hysteretic comparator 120 are based on Dref. For example, the upper threshold value is a first amount greater than Dref, while the lower threshold value is a second amount less than Dref. In one example, the first and second amounts are equal. Accordingly, the hysteretic comparator 120 is configured to receive the subtractor signal Dload and compare Dload to the upper and lower threshold values. An output of the hysteretic comparator 120 is an error signal (e.g., an analog voltage or a digital value). The error signal is proportional to the difference between Dload and the upper threshold value responsive to Dload being greater than the upper threshold value. The error signal is proportional to the difference between Dload and the lower threshold value responsive to Dload being less than the lower threshold value. Finally, the error signal is a fixed value, such as zero, responsive to Dload being between the upper and lower threshold values.

The motor controller 102 also includes a closed-loop controller 122, which can be a proportional-integral (PI) or a proportional-integral-derivative (PID) closed-loop controller 122 in some examples. Irrespective of the particular implementation, the closed-loop controller 122 receives the error signal from the error amplifier 120, or hysteretic comparator 120. The closed-loop controller 122 is configured to multiply the error signal by a transfer function of the closed-loop controller 122 and to provide a resultant control signal as its output. The control signal may be a digital value that is the product of multiplying the error signal by the transfer function.

In some examples, the motor controller 102 also includes a DAC 124 that receives the control signal from the closed-loop controller 122. The DAC 124 is configured to convert the digital control signal to an analog voltage, and to provide the analog voltage (e.g., a DAC signal) as its output. The DAC signal is useful to adjust the reference regulation level for the peak current level Ipeak for the stepper motor 106, such as when the processing device 108 is configured to adjust the reference regulation level responsive to an analog indication. For example, the processing device 108 may include analog elements, such as sense elements, which receive the DAC 124 output and process the DAC 124 output to adjust the reference regulation level for the peak current level for the stepper motor 106.

For example, the processing device 108 receives the DAC signal from the DAC 124 and adjusts the peak current level (Ipeak) of the current provided to the stepper motor 106 by the motor driver 104. In one example, the DAC 124 is configured to provide the DAC signal in a range from ground (e.g., approximately 0 V) to a reference voltage (e.g., approximately 3.3 V), and a maximum peak coil current (e.g., corresponding to a peak load torque) (e.g., approximately 10 A) and a minimum peak coil current (e.g., corresponding to a light load torque) (e.g., approximately 1 A). In this numerical example, the processing device 108 is configured to regulate Ipeak to a value between around 1 A and 10 A responsive to the value of the DAC signal between around 0-3.3 V.

In a first example, a mechanical load on the stepper motor 106 decreases from a first load to a second load, which is less than the first load. As a numerical example, the peak current level Ipeak at the first load is 10 A, and the loaded duty cycle (Dload) is regulated to the reference duty cycle (Dref). Initially (e.g., prior to the value of Ipeak being adjusted by the processing device 108), the calculated duty cycle (Dcalculated) decreases due to the decrease in mechanical load on the stepper motor 106, and thus Dload also decreases accordingly and is less than Dref The error signal from the error amplifier 120 is a negative value responsive to Dload being less than Dref (or Dload being less than the lower threshold in the example of a hysteretic comparator 120), which causes the closed-loop controller 122 to decrease the control signal value provided as its output. The DAC 124 generates a decreased DAC signal voltage responsive to the decrease in the control signal value, which causes the processing device 108 to adjust the value of Ipeak downward. This closed-loop control process continues until Dload is equal to Dref (or within the upper and lower threshold values of Dref, in the example of a hysteretic comparator 120), and Ipeak is regulated to a level that corresponds to the second load, such as 5 A.

In a second example, a mechanical load on the stepper motor 106 increases from a first load to a second load, which is greater than the first load. As a numerical example, the peak current level Ipeak at the first load is 5 A, and the loaded duty cycle (Dload) is regulated to the reference duty cycle (Dref). Initially (e.g., prior to the value of Ipeak being adjusted by the processing device 108), the calculated duty cycle (Dcalculated) increases due to the increase in mechanical load on the stepper motor 106, and thus Dload also increases accordingly and is greater than Dref The error signal from the error amplifier 120 is a positive value responsive to Dload being greater than Dref (or Dload being greater than the upper threshold in the example of a hysteretic comparator 120), which causes the closed-loop controller 122 to increase the control signal value provided as its output. The DAC 124 generates an increased DAC signal voltage responsive to the increase in the control signal value, which causes the processing device 108 to adjust the value of Ipeak upward. This closed-loop control process continues until Dload is equal to Dref (or within the upper and lower threshold values of Dref, in the example of a hysteretic comparator 120), and Ipeak is regulated to a level that corresponds to the second load, such as 10 A.

By allowing the peak coil current in the stepper motor 106 to decrease under lighter mechanical loading, $I^2R$ losses are reduced, which in turn increases power efficiency at submaximal load torques. Additionally, because of decreased coil currents (e.g., not always operating at a desired peak coil current irrespective of mechanical load) in the stepper motor 106, controlled as described above, the stepper motor 106 can be designed with smaller heat transfer component(s) (and thus motor form factors), and can have increased durability and/or reliability.

Figure 4:
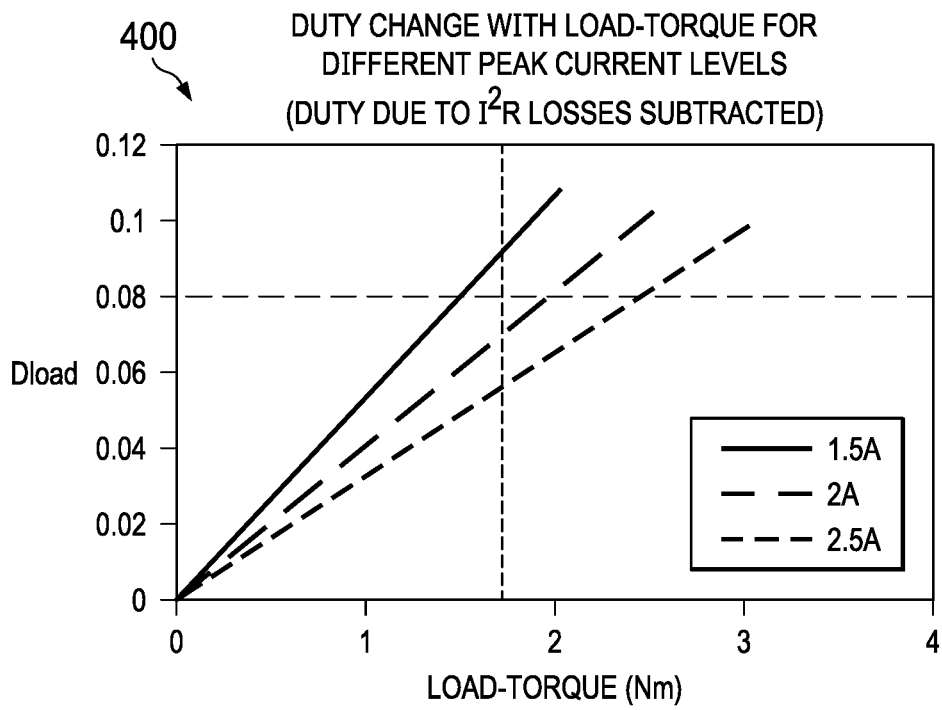
FIG. 4 is a graph of loaded duty cycle values as a function of motor load torque, and for different peak current levels in accordance with various examples.

FIG. 4 is a graph 400 of loaded duty cycle values (Dload) as a function of motor load torque (e.g., in Newton-meters (Nm)), and for different peak current levels. In this example, Dref is represented by the dashed line at a duty cycle of 0.08, and the mechanical load on the stepper motor 106 is represented by the dashed line at a motor load torque of 1.7 Nm. In another example with a hysteretic comparator 120, the dashed line at 0.08 duty cycle is replaced by two dashed lines corresponding to the upper and lower threshold values of Dref. Irrespective of the particular implementation of the comparison Dref (e.g., an error amplifier 120 or a hysteretic comparator 120), the graph 400 demonstrates how adjusting the peak current level maintains the loaded duty cycle Dload at the desired value (e.g., Dref of 0.08) responsive to a change in the mechanical load on the stepper motor 106.

Figure 5:
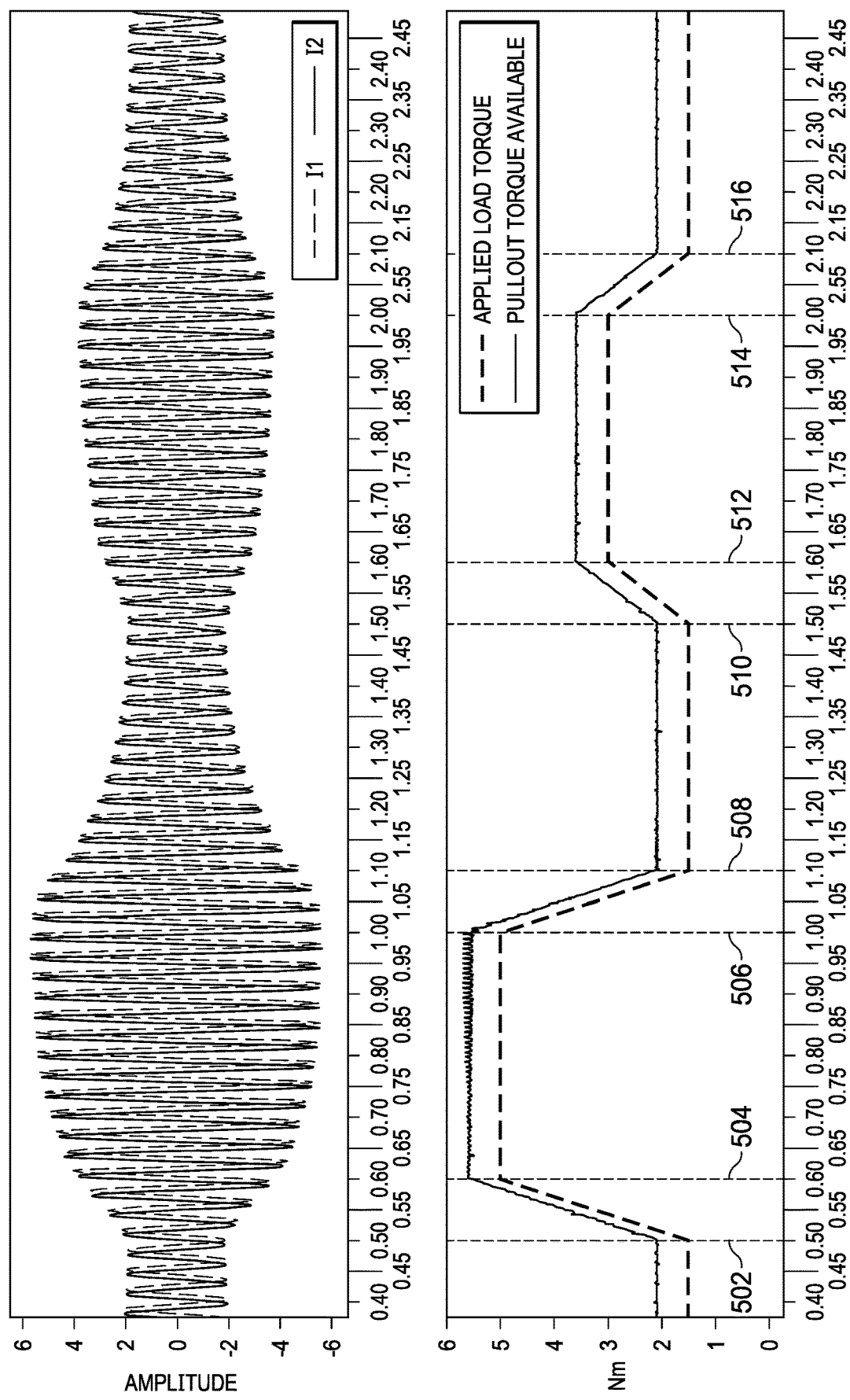
FIG. 5 is a graph of variations in peak current levels in response to varying motor load torques in accordance with various examples.

In a first example, the peak current level is 1.5 A prior to the mechanical load on the stepper motor 106 being 1.7 Nm as shown in FIG. 4. Subsequently, the mechanical load on the stepper motor 106 increases to 1.7 Nm as shown in FIG. 4, and thus Dload for a peak current of 1.5 A is greater than Dref. Accordingly, the peak current level is increased so that Dload is regulated to Dref for the mechanical load of 1.7 Nm In a second example, the peak current level is 2.0 A prior to the mechanical load on the stepper motor 106 being 1.7 Nm as shown in FIG. 4. Subsequently, the mechanical load on the stepper motor 106 decreases to 1.7 Nm as shown in FIG. 4, and thus Dload for a peak current of 2.0 A is less than Dref. Accordingly, the peak current level is decreased so that Dload is regulated to Dref for the mechanical load of 1.7 Nm FIG. 5 is a graph 500 of variations in peak current levels in response to varying motor load torques in accordance with various examples. The I1 and I2 waveforms correspond to currents through first and second coils of the stepper motor 106 as a function of time. The applied load torque waveform corresponds to the mechanical load (e.g., in Nm) on the stepper motor 106. The pullout torque available waveform corresponds to a threshold amount of torque that can be supported by the stepper motor 106 without stalling. The pullout torque is proportional to the current provided to the stepper motor 106. As shown in FIG. 5, the pullout torque is greater than the applied mechanical load torque, which indicates that the stepper motor 106 does not stall in this example.

At time 502, the applied load torque begins to increase from 1.5 Nm, and stabilizes at time 504 at 5 Nm. Accordingly, Ipeak is adjusted upward beginning at time 502 and begins to stabilize responsive to the load torque settling at 5 Nm. I1 and I2 are regulated according to Ipeak as it is adjusted upward.

At time 506, the applied load torque begins to decrease from 5 Nm, and stabilizes at time 508 back at 1.5 Nm. Accordingly, Ipeak is adjusted downward beginning at time 506 and begins to stabilize responsive to the load torque settling at 1.5 Nm. I1 and I2 are regulated according to Ipeak as it is adjusted downward.

At time 510, the applied load torque begins to increase from 1.5 Nm, and stabilizes at time 512 at 3 Nm. Accordingly, Ipeak is adjusted upward beginning at time 510 and begins to stabilize responsive to the load torque settling at 3 Nm, and at a peak current level that is lower than the peak current level corresponding to the load torque settling at 5 Nm. I1 and I2 are regulated according to Ipeak as it is adjusted upward.

At time 514, the applied load torque begins to decrease from 3 Nm, and stabilizes at time 516 back at 1.5 Nm. Accordingly, Ipeak is adjusted downward beginning at time 514 and begins to stabilize responsive to the load torque settling at 1.5 Nm. I1 and I2 are regulated according to Ipeak as it is adjusted downward.

Figure 6:
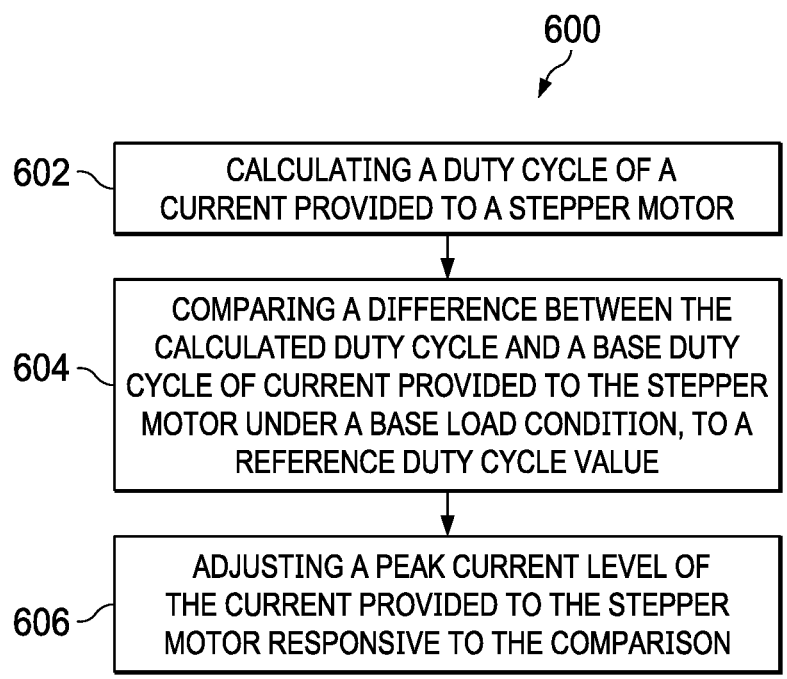
FIG. 6 is a flow chart of a method for peak current regulation of a stepper motor using duty cycle feedback in accordance with various examples.

FIG. 6 is a flow chart of a method 600 for peak current regulation of a stepper motor 106 using duty cycle feedback in accordance with various examples. The method 600 begins in block 602 with calculating a duty cycle of a current provided to the stepper motor 106. As described above, the peak current duty cycle D is a weighted average over a half-cycle of current waveform I1 or I2. In an example, the calculated peak current duty cycle is a weighted average of the duty cycle at each step in a half-cycle of a sinusoidal current waveform. As demonstrated above, the weights at each step can correspond to sinusoidal coefficients derived for the number of microsteps in a quadrant of the sinusoidal current waveform.

The method 600 continues in block 604 with comparing a difference between the calculated duty cycle and a base duty cycle of current provided to the stepper motor under a base load condition, to a reference duty cycle value. The base duty cycle is based on the current provided to the stepper motor 106 under a base load condition, such as a no-load condition in which a mechanical load is not coupled to the stepper motor 106. The reference duty cycle is based on the current provided to the stepper motor 106 under a maximal load condition, and with a maximal peak current level. Both the base duty cycle and the reference duty cycle can be user-configurable values, which can depend on the particular application of the stepper motor 106. In an example, the subtractor 118 provides the difference between the calculated duty cycle and the base duty cycle, while the error amplifier 120 or hysteretic comparator 120 compares the resulting difference to the reference duty cycle value.

The method 600 continues in block 606 with adjusting a peak current level of the current provided to the stepper motor 106 responsive to the comparison. As described above, the loaded duty cycle (or the difference between the calculated duty cycle and the reference duty cycle) decreases responsive to a decrease in the mechanical load on the stepper motor 106. The closed-loop controller 122, the DAC 124, and the processing device 108 are configured to reduce Ipeak in response to a decrease in the loaded duty cycle, in order to maintain the loaded duty cycle at approximately the reference duty cycle. Also, the loaded duty cycle increases responsive to an increase in the mechanical load on the stepper motor 106. The closed-loop controller 122, the DAC 124, and the processing device 108 are configured to increase Ipeak in response to an increase in the loaded duty cycle, in order to maintain the loaded duty cycle at approximately the reference duty cycle.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A method for controlling a stepper motor, the method comprising:

calculating a duty cycle of a current provided to the stepper motor;
comparing a difference between the calculated duty cycle and a base duty cycle of current provided to the stepper motor under a base load condition, to a reference duty cycle value; and
adjusting a peak current level of the current provided to the stepper motor responsive to the comparison.

2. The method of claim 1, wherein adjusting the peak current level comprises:
increasing the peak current level responsive to the calculated duty cycle being greater than the reference duty cycle; and
decreasing the peak current level responsive to the calculated duty cycle being less than the reference duty cycle.

3. The method of claim 1, wherein calculating the duty cycle comprises calculating an average duty cycle of the current provided to the stepper motor over a half-cycle of a current waveform.

4. The method of claim 1, wherein the base duty cycle and the reference duty cycle are user-configurable values.

5. The method of claim 1, wherein a mechanical load is not coupled to the stepper motor in the base load condition.

6. The method of claim 1, wherein the reference duty cycle is of a current provided to the stepper motor under a maximal load condition, and with a maximal peak current level.

7. The method of claim 1, comprising comparing the difference to an upper threshold value and to a lower threshold value, wherein the upper threshold value equals the reference duty cycle value plus a first amount, and wherein the lower threshold value equals the reference duty cycle value minus a second amount.

8. A device adapted to be coupled to a stepper motor and operable to control the stepper motor, the device comprising:
a processing device having a first output adapted to be coupled to the stepper motor and a second output, the processing device configured to:
calculate a duty cycle of a current provided to a stepper motor; and
output, at the second output, a calculated duty cycle signal indicative of the calculation;
at least one register coupled to the processing device and configured to store a base duty cycle value of current provided to the stepper motor under a base load condition, and to store a reference duty cycle value;
a subtractor coupled to the processing device and to the at least one register, the subtractor configured to:
receive the calculated duty cycle signal; and
provide a subtractor signal responsive to a difference between the calculated duty cycle and the base duty cycle value; and
an error amplifier coupled to the subtractor and to the at least one register, the error amplifier configured to:
receive the subtractor signal;
compare the subtractor signal to the reference duty cycle value; and
provide an error signal responsive to the comparison;
wherein the processing device is further configured to adjust a peak current level of the current provided to the stepper motor responsive to the error signal.

9. The device of claim 8, wherein the processing device is configured to:
increase the peak current level responsive to the error signal being a positive value; and
decrease the peak current level responsive to the error signal being a negative value.

10. The device of claim 8, wherein the duty cycle calculated by the processing device comprises an average duty cycle of the current provided to the stepper motor over a half-cycle of a current waveform.

11. The device of claim 8, wherein the at least one register is a user-configurable register.

12. The device of claim 8, wherein the reference duty cycle is of a current provided to the stepper motor under a maximal load condition, and with a maximal peak current level.

13. The device of claim 8, wherein the error amplifier is a hysteretic comparator configured to:
compare the subtractor signal to an upper threshold value; and
compare the subtractor signal to a lower threshold value;
wherein the upper threshold value equals the reference duty cycle value plus a first amount, and the lower threshold value equals the reference duty cycle value minus a second amount.

14. A system adapted to be coupled to a stepper motor and operable to control the stepper motor, the system comprising:
a driver coupled to the stepper motor, the driver configured to control a voltage applied to the stepper motor; and
a controller coupled to the driver, the controller configured to:
calculate a duty cycle of a current provided to the stepper motor;
compare a difference between the calculated duty cycle and a base duty cycle of current provided to the stepper motor under a base load condition, to a reference duty cycle value; and
adjust a peak current level of the current provided to the stepper motor responsive to the comparison.

15. The system of claim 14, wherein the controller is configured to:
increase the peak current level responsive to the calculated duty cycle being greater than the reference duty cycle; and
decrease the peak current level responsive to the calculated duty cycle being less than the reference duty cycle.

16. The system of claim 14, wherein the duty cycle calculated by the controller comprises an average duty cycle of the current provided to the stepper motor over a half-cycle of a current waveform.

17. The system of claim 14, wherein the base duty cycle and the reference duty cycle are user-configurable values.

18. The system of claim 14, wherein a mechanical load is not coupled to the stepper motor in the base load condition.

19. The system of claim 14, wherein the reference duty cycle is of a current provided to the stepper motor under a maximal load condition, and with a maximal peak current level.

20. The system of claim 14, wherein the controller is configured to compare the difference to an upper threshold value and to a lower threshold value, wherein the upper threshold value equals the reference duty cycle value plus a first amount, and wherein the lower threshold value equals the reference duty cycle value minus a second amount.

* * * * *